United States Patent
Elpelt

(10) Patent No.: US 8,264,016 B2
(45) Date of Patent: Sep. 11, 2012

(54) SEMICONDUCTOR DEVICE INCLUDING A CHANNEL STOP ZONE

(75) Inventor: Rudolf Elpelt, Erlangen (DE)

(73) Assignee: Infineon Technologies Austria AG, Villach (AT)

( * ) Notice: Subject to any disclaimer, the term of this patent is extended or adjusted under 35 U.S.C. 154(b) by 198 days.

(21) Appl. No.: 12/836,308

(22) Filed: Jul. 14, 2010

(65) Prior Publication Data

US 2012/0012902 A1    Jan. 19, 2012

(51) Int. Cl.
*H01L 29/80* (2006.01)
*H01L 29/76* (2006.01)
*H01L 29/94* (2006.01)

(52) U.S. Cl. ........ 257/263; 257/264; 257/265; 257/285; 257/E29.118; 438/192; 438/194

(58) Field of Classification Search .................. 257/263, 257/264, 265, 285, E29.118; 438/192, 194
See application file for complete search history.

(56) References Cited

U.S. PATENT DOCUMENTS

| | | | | |
|---|---|---|---|---|
| 5,652,150 A | * | 7/1997 | Wadsworth et al. | 438/60 |
| 6,756,653 B2 | * | 6/2004 | Farrar | 257/510 |
| 7,615,802 B2 | | 11/2009 | Elpelt et al. | |
| 7,741,661 B2 | * | 6/2010 | Disney et al. | 257/272 |
| 2006/0255373 A1 | | 11/2006 | Elpelt et al. | |
| 2008/0197445 A1 | * | 8/2008 | Disney et al. | 257/506 |

FOREIGN PATENT DOCUMENTS

| | | |
|---|---|---|
| DE | 10145765 B4 | 9/2004 |
| DE | 10350160 A1 | 9/2005 |
| EP | 1604404 B1 | 12/2005 |

* cited by examiner

*Primary Examiner* — Ngan Ngo
(74) *Attorney, Agent, or Firm* — Murphy, Bilak & Homiller, PLLC

(57) ABSTRACT

A semiconductor device as described herein includes a body region of a first conductivity type adjoining a channel region of a second conductivity at a first side of the channel region. A gate control region of the first conductivity type adjoins the channel region at a second side of the channel region opposed to the first side, the channel region being configured to be controlled in its conductivity by voltage application between the gate control region and the body region. A source zone of the second conductivity type is arranged within the body region and a channel stop zone of the second conductivity type is arranged at the first side, the channel stop zone being arranged at least partly within at least one of the body region and the channel region. The channel stop zone includes a maximum concentration of dopants lower than a maximum concentration of dopants of the source zone.

18 Claims, 6 Drawing Sheets

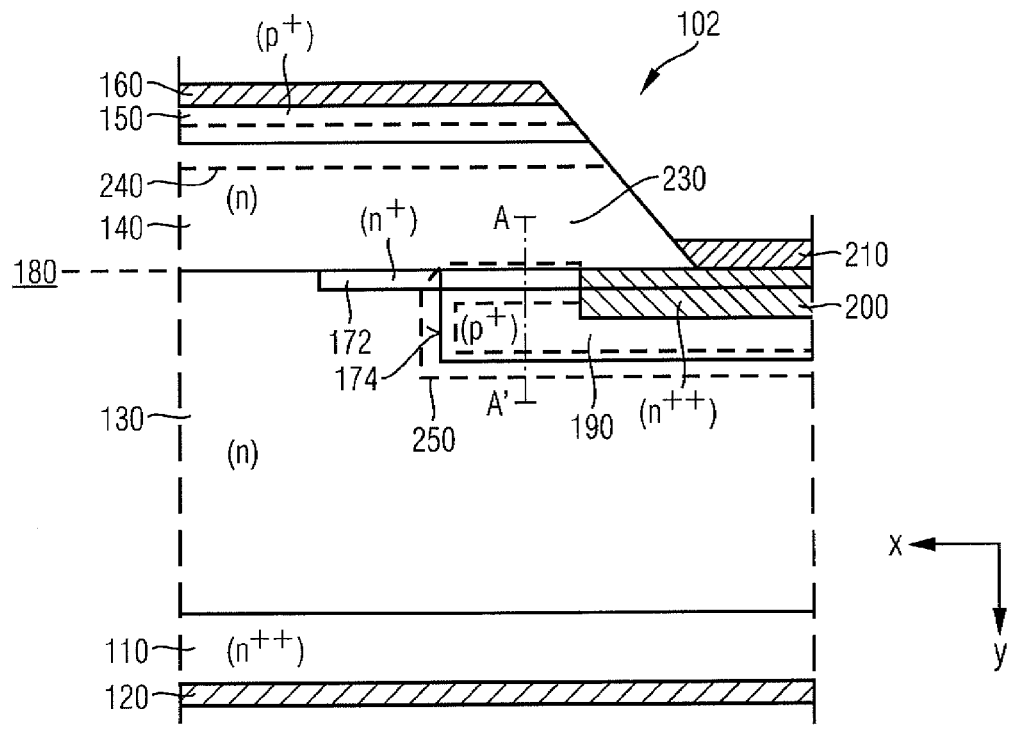
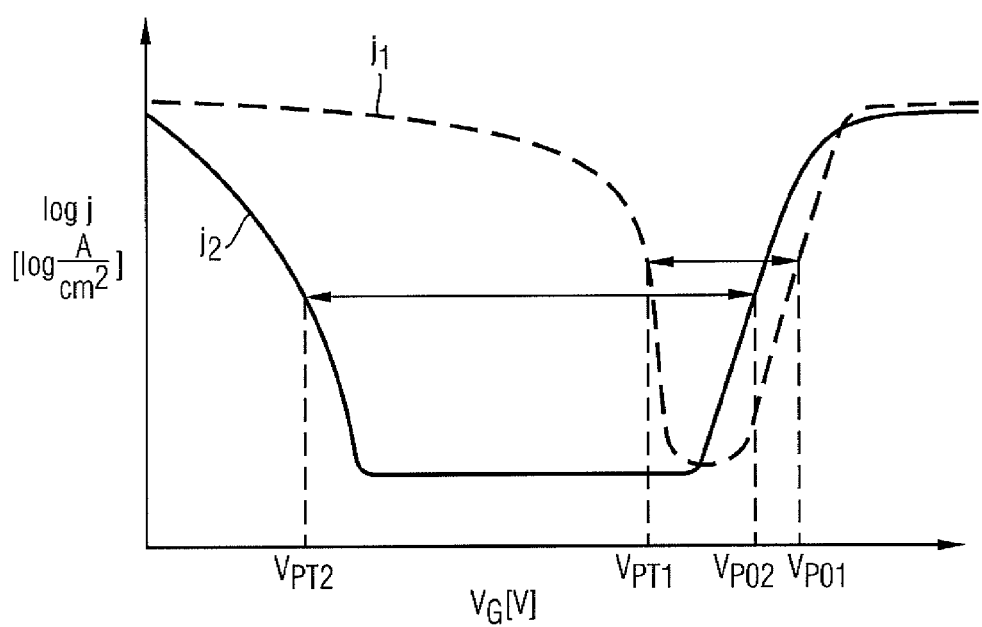

SEMICONDUCTOR DEVICE INCLUDING A CHANNEL STOP ZONE

BACKGROUND OF THE INVENTION

Semiconductor devices such as Junction Field Effect Transistors (JFETs) are widely used for a variety of semiconductor applications such as high-power applications or high-voltage applications including semiconductor switches. Device characteristics of the JFET such as turn-on behavior, turn-off behavior and response speed are closely related to the device layout.

To meet the requirements of improved turn-on behavior, turn-off behavior and response speed, a need exists for a device layout that is capable to meet those requirements.

For these and other reasons there is a need for the present invention.

SUMMARY

According to an embodiment of a semiconductor device, the device includes a body region of a first conductivity type adjoining a channel region of a second conductivity at a first side of the channel region. A gate control region of the first conductivity type adjoins the channel region at a second side of the channel region opposed to the first side, the channel region being configured to be controlled in its conductivity by voltage application between the gate control region and the body region. A source zone of the second conductivity type is arranged within the body region and a channel stop zone of the second conductivity type is arranged at the first side, the channel stop zone being arranged at least partly within at least one of the body region and the channel region. The channel stop zone includes a maximum concentration of dopants lower than a maximum concentration of dopants of the source zone.

According to an embodiment of a method of manufacturing a semiconductor device, the method includes forming a body region of a first conductivity type adjoining a channel region of a second conductivity at a first side of the channel region. The method further includes forming a gate control region of the first conductivity type adjoining the channel region at a second side of the channel region opposed to the first side. The channel region is configured to be controlled in its conductivity by voltage application between the gate control region and the body region. The method also includes forming a source zone of the second conductivity type within the body region and forming a channel stop zone of the second conductivity type arranged at the first side. The channel stop zone is arranged at least partly within at least one of the body region and the channel region. The channel stop zone includes a maximum concentration of dopants lower than a maximum concentration of dopants of the source zone.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Features and advantages of embodiments will be apparent from the following description with reference to the accompanying drawings. The drawings are not necessarily to scale and emphasis is placed upon illustrating the principles. The features of the various illustrated embodiments can be combined in any way unless they exclude each other.

FIG. 5 illustrates a cross-sectional view of a portion of a VJFET including a channel stop zone laterally projecting an end portion of a body region according to another embodiment.

FIG. 6 is a diagram illustrating current density j versus gate voltage $V_G$ characteristics of a JFET including a channel stop zone and of a JFET lacking a channel stop zone, respectively according to yet another embodiment.

DETAILED DESCRIPTION

Figure 1:
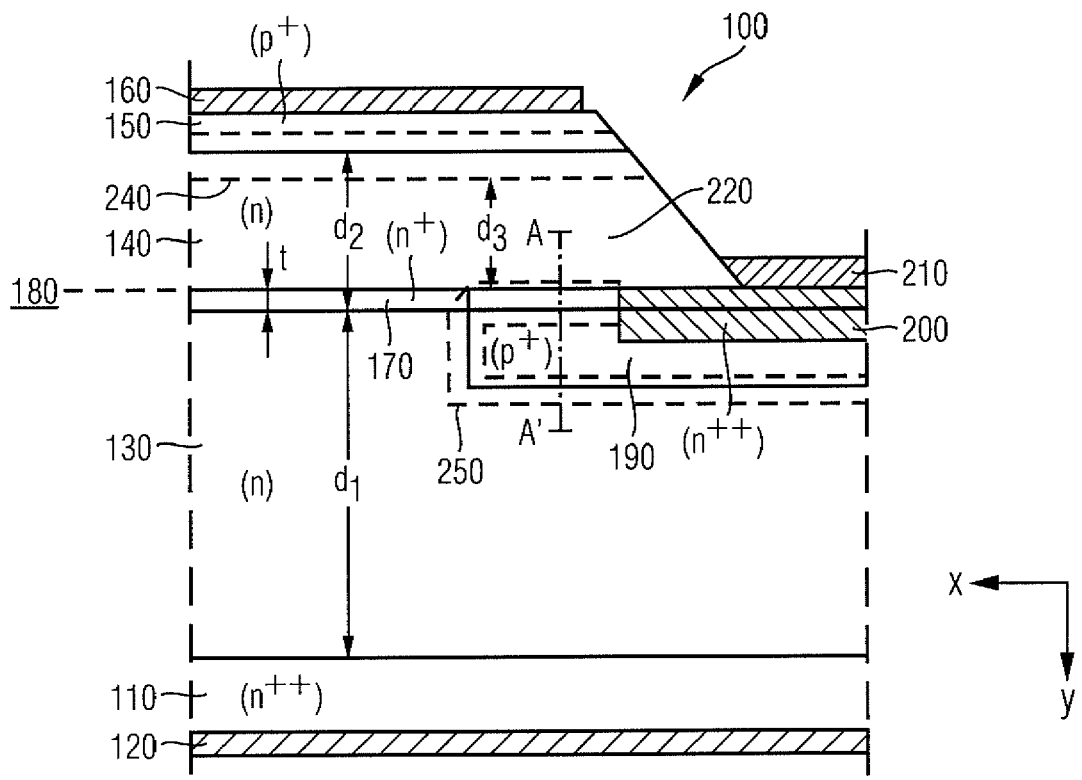
FIG. 1 illustrates a cross-sectional view of a portion of a Vertical Junction Field Effect Transistor (VJFET) including a channel stop zone according to an embodiment.

FIG. 1 illustrates a vertical JFET 100 including a lateral n-channel. JFET 100 includes an $n^{++}$-type semiconductor body 110 being electrically coupled to a drain contact 120. A first n-type layer 130 is formed on the $n^{++}$-type semiconductor body 110. A second n-type layer 140 is formed on the first n-type layer 130.

A $p^+$-type gate control region is formed on the second n-type layer 140 or is embedded into the second n-type layer 140 adjoining the surface thereof. The $p^+$-type gate control region 150 is electrically coupled to a gate contact 160.

An $n^+$-type channel stop zone 170 is formed at an interface 180 between the first layer 130 and the second layer 140. A $p^+$-type body region 190 is formed within the first layer 130 adjoining to the interface 180.

An $n^{++}$-type source zone 200 is formed within the first layer 130 adjoining to the interface 180. A source contact 210 is electrically coupled to the source zone 200. The source contact may also be electrically coupled to the p+ body region 190 (not illustrated in FIG. 1). A lateral n-channel 220 is arranged between the gate control region 150 and the body region 190. By applying a voltage between the gate contact 160 and the source contact 210, the conductivity within the lateral n-channel may be controlled.

As used herein, the term "electrically coupled" is not meant to mean that the elements must be directly coupled together but intervening elements may be provided between the "electrically coupled" elements.

In JFET 100 illustrated in FIG. 1, the semiconductor regions are denoted by n-type or p-type. According to other embodiments, the conductivity type of these regions may be vice versa.

Further details on the dopant concentration of the semiconductor regions illustrated in FIG. 1 is given by specifying these regions as n-type, $n^+$-type or $n^{++}$-type, meaning that a maximum dopant concentration within the region denoted $n^{++}$-type is higher than the maximum dopant concentration within the region denoted $n^+$-type. Furthermore, the maximum dopant concentration within the region denoted $n^+$-type is higher than the maximum dopant concentration within the region denoted n-type. Thus, the terminology n-type, $n^+$-type and $n^{++}$-type allows to distinguish these regions with regard to their maximum dopant concentration relative to each other. However, different regions having the same designation such as the designation "n-type" for both the first layer 130 and the second layer 140 does not imply that these two regions have a same maximum dopant concentration. Thus, the maximum dopant concentration of the first layer 130 may be different from the maximum dopant concentration within the second layer 140 although the maximum dopant concentration of each one of these two layers, namely first layer 130 and second layer 140, is smaller than the maximum dopant concentration of a region denoted $n^+$-type such as the channel stop zone 170.

The semiconductor body 110 may be formed of SiC. Both the first layer 130 and the second layer 140 may be grown by epitaxy and may thus also be formed of SiC. A dopant concentration within the first layer 130 is one parameter to adjust the voltage blocking capability of the device. Increasing the voltage blocking capability of the device may be achieved by decreasing the dopant concentration within the first layer 130, for example. As an example, the dopant concentrations within each one of the first and second layers 130, 140 may be between $5 \times 10^{14}$ cm$^{-3}$ and $3 \times 10^{16}$ cm$^{-3}$, in particular between $1 \times 10^{15}$ cm$^{-3}$ and $2 \times 10^{16}$ cm$^{-3}$ depending on the desired blocking voltage. A thickness $d_1$ of the first layer 130, i.e. the dimension along a vertical direction y, is a further parameter to adjust the voltage blocking capability of the device and may be between 3 to 100 μm, in particular between 4 to 50 μm.

A thickness $d_2$ of the second layer 140 may be between 0.5 to 3 μm, in particular between 0.7 to 1.2 μm. By setting the dopant concentration and the thickness of the first layer within the ranges specified above, a voltage blocking capability of the device of at least 300 V to more than 10000 V may be achieved, in particular a voltage blocking capability of 600 V to 6500V.

With regard to SiC as the semiconductor material for the first and second layers 130, 140, dopants such as B and/or Al may be chosen to form semiconductor regions of p-type conductivity and dopants such as N and/or P to form regions of n-type conductivity.

A thickness t of the channel stop zone 170 may be between 5 nm and 100 nm, in particular between 10 and 30 nm. A maximum dopant concentration within this zone may be within a range of $10^{17}$ cm$^{-3}$ to $10^{19}$ cm$^{-3}$. The thickness t and the profile of dopants may be appropriately chosen to confine a built-in voltage of the pn junction formed between the channel stop zone 170 and the second layer 140 as the n-type region(s) and the $p^+$-type body region 190 as the p-type region to the channel stop zone 170 and the p-type body region 190. In other words, these parameters may be chosen appropriately to keep the space charge region associated with the built-in voltage in the n-type region within the channel stop zone 180. Thus, along the vertical direction y, the space charge region associated with the built-in voltage does not penetrate into the second layer 140.

The dopant concentration within each one of the semiconductor body 110, the gate control region 150 and the source zone 200 may be appropriately chosen to form an ohmic contact with the respective material of the contact formed thereon. Each one of the contacts, i.e. the drain contact 120, the gate contact 160 and the source contact 210 may include a conductive material such as doped polysilicon or metal, e.g. anyone or a combination of Ni, Al, Ta, Ti and G.

JFET 100 illustrated in FIG. 1 is denoted a vertical JFET having a lateral channel since a current flowing from the source contact 210 to the drain contact 120 passes the lateral channel 220 arranged between the gate control region 150 and the body region 190 along a lateral direction x and then passes through the first layer 130 and the semiconductor body 110 along the vertical direction y to the drain contact 120.

The conductivity of the lateral channel 220 may be controlled by applying a voltage between the gate contact 160 and the source contact 210. A contact to the body region 190 (not illustrated in FIG. 1) and the source contact 210 may be short-circuited, for example.

Along the vertical direction, the lateral channel 220 adjoins to a first space charge region 240 formed between the gate control region 150 and the second layer 140 and the lateral channel 220 furthermore adjoins to a second space charge region 250 formed between the body region 190 and the channel stop zone 170/second layer 140.

By applying a voltage between the source contact 210 and the gate contact 190, the dimensions of the space charge regions 240, 250 may be controlled along the vertical direction y. In other words, a thickness $d_3$ of the lateral channel 220 determining the lateral conductivity of the channel 220 may also be controlled by the voltage applied between the source contact 210 and the gate contact 190. By forming the $n^+$-type channel stop zone 170 the extension of the second space charge region 250 into the second layer 140 may be reduced compared to a device lacking the $n^+$-type channel stop zone. Due to the higher dopant concentration of the $n^+$-type channel stop zone 170 compared to the second layer 140, the $n^+$-type channel stop zone 170 absorbs the built-in voltage of the second space charge region 250 within smaller dimensions along the vertical direction y. As an example, the thickness t and dopant concentration of the channel stop zone 170 may be appropriately chosen to absorb the built-in voltage of the second space charge region 250 within the channel stop zone and to thus avoid extension of the second space charge region 250 into the second layer 140.

Figure 2:
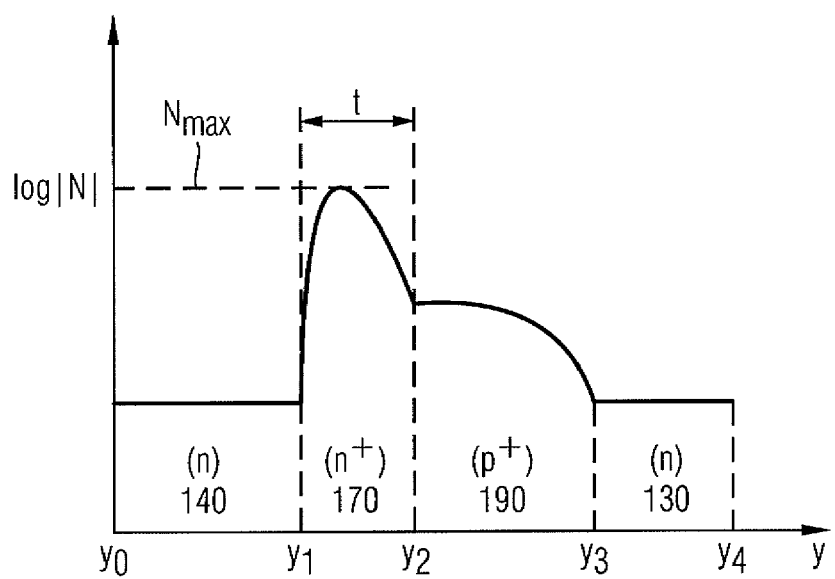
FIG. 2 is a diagram illustrating a dopant profile along the line AA' of the JFET illustrated in FIG. 1, the JFET including a channel stop zone formed by ion implantation and annealing.

FIG. 2 is a diagram illustrating a profile of dopant concentration along the vertical direction y of line A-A' of JFET 100 illustrated in FIG. 1. It is to be noted that the profile of dopants in each region, i.e. in the second layer 140 between y0 and y1, in the channel stop zone 170 between y1 and y2, in the body region 190 between y2 and y3 and in the second layer 130 between y3 and y4 illustrates only those dopant species within the respective region that determine(s) the conductivity type of that region. In other words and as an example, the profile of dopant concentration of the channel stop zone 170 between y1 and y2 only refers to n-type dopants but does not include any p-type dopants that may also be present within that region. Thus, the profile of dopant concentrations illustrated in FIG. 2 does not illustrate net-dopings in each one of the regions 140, 170, 190, 130.

Within the first and second layers 130, 140, i.e. along the vertical direction between y3 and y4 and accordingly between y0 and y1, the concentration of dopants is constant and may be formed by in-situ doping during epitaxial growth of these layers, for example. However, according to other embodiments the concentration of dopants may vary in these regions, e.g. the second layer may also include a part of higher dopant concentration than in the other parts.

The profile of dopants within the body region 190, i.e. along the vertical direction between y2 and y3, is determined by p-type dopants introduced into the first layer 130 before formation of the second layer 140. As an example, these dopants may be introduced into the first layer 130 by ion implantation and annealing.

The n-type dopants constituting the n$^+$-type channel stop zone 170 may be formed similar to the p-type dopants defining the body region 190, i.e. the n-type dopants may be introduced into the first layer 130 before formation of the second layer 140 by ion implantation or diffusion, for example. The thickness t specifying the dimensions of the channel stop zone 170 along the vertical direction y corresponds to y2-y1, y1 specifying that point along the line A-A' where the profile of n-type dopants constituting the second layer 140 crosses the profile of n-type dopants constituting the channel stop zone 170, y2 being that point along line A-A' where the profile of n-type dopants constituting the channel stop zone 170 crosses the profile of p-type dopants constituting the body region 190.

When forming the channel stop zone 170 by ion implantation and annealing, the thickness t and the maximum concentration of dopants within this region may be adjusted by implant parameters such as implant dose and implant energy. As an example, the implant dose may be chosen to be between $10^{12}$ cm$^{-2}$ and $10^{13}$ cm$^{-2}$ and the implant energy may be chosen to be between 10 and 50 keV for the n-type dopant N introduced into SiC material.

Figure 3:
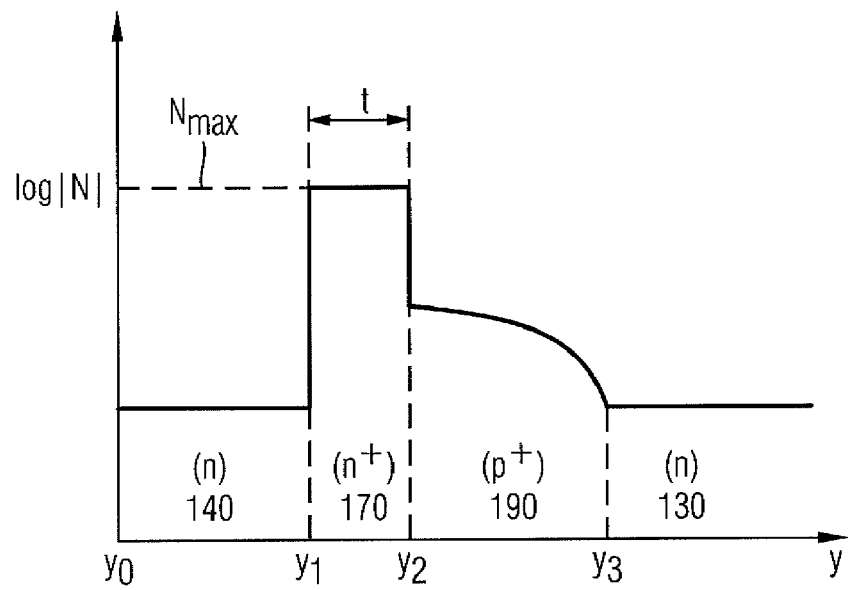
FIG. 3 is a diagram illustrating a dopant profile along the line AA' of the JFET illustrated in FIG. 1, the JFET including channel stop zone being formed by in-situ doping.

FIG. 3 is a diagram illustrating a profile of dopant concentration along the vertical direction of line A-A' of JFET 100 illustrated in FIG. 1. The profile of dopant concentration illustrated in FIG. 3 and the profile of dopant concentration illustrated in FIG. 2 differ in the channel stop zone 170 between y1 and y2. In the embodiment illustrated in FIG. 3, the n-type dopants constituting the channel stop zone 170 are introduced by in-situ doping, i.e. by introducing these dopants at the same time the first layer 130 and/or the second layer 140 is formed. As an example, in-situ doping may involve the addition of dopant gases to the reactant gases used in the deposition of the first and/or second layer 130, 140.

Figure 4:
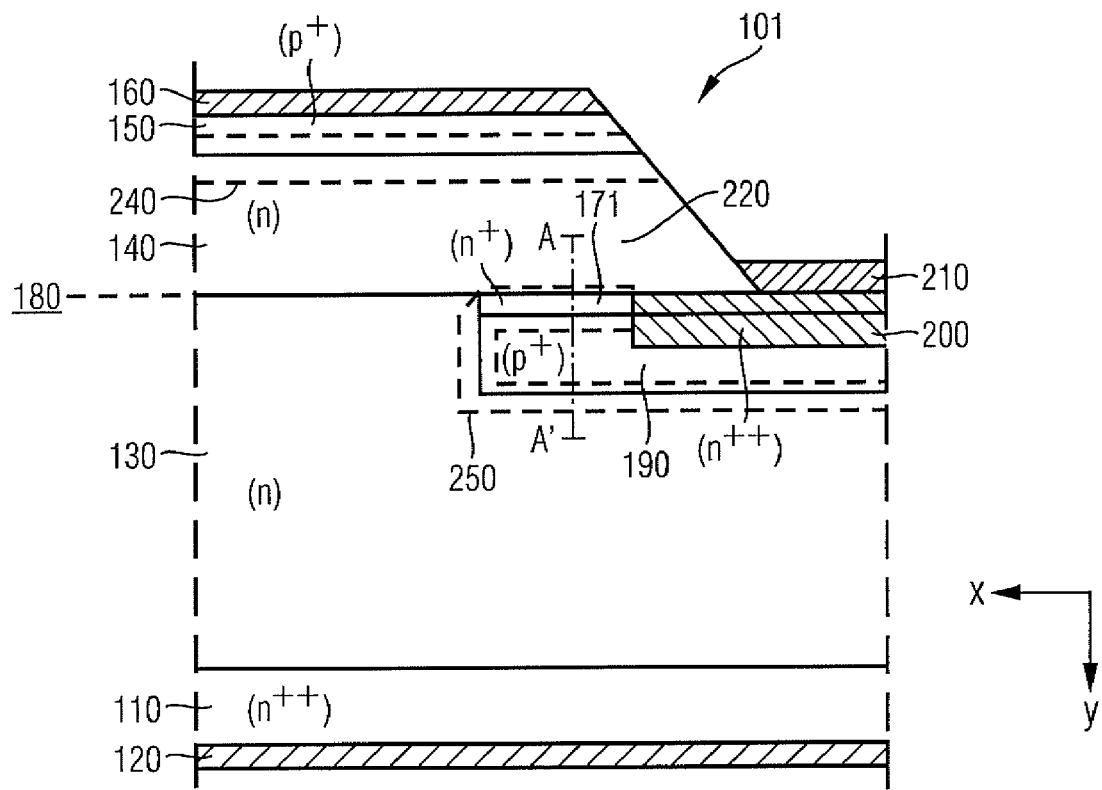
FIG. 4 illustrates a cross-sectional view of a portion of a VJFET including a channel stop zone and a body region having same lateral dimensions according to an embodiment.

FIG. 4 illustrates a schematical cross-sectional view of a portion of the vertical JFET 101 having the lateral channel 220. JFET 101 illustrated in FIG. 4 differs from JFET 100 illustrated in FIG. 1 in the arrangement of the channel stop zone. Dimensions of n$^+$-type channel stop zone 171 of JFET 101 with regard to the plane of the interface 180 correspond to the dimensions of the body region 190 with regard to said plane. Thus, a single lithographic mask may be used for forming both the body region 190 and the channel stop zone 170.

FIG. 5 illustrates a schematic cross-sectional view of a portion of the vertical JFET 102 having the lateral channel 220. JFET 102 illustrated in FIG. 5 differs from JFET 100 illustrated in FIG. 1 in the arrangement of the channel stop zone. The channel stop zone 172 projects an end portion 174 of the body region 190 along a direction parallel to interface 180.

FIG. 6 is a diagram illustrating current densities j between source and drain versus a gate voltage $V_G$ of a JFET. The curves denoted by $j_1$ and $j_2$ refer to a JFET that in case of $j_1$ lacks a channel stop zone and in case of $j_2$ includes the channel stop zone. As an example, the curve denoted by $j_1$ may refer to JFET 100 illustrated in FIG. 1 without the channel stop zone 170 and the curve denoted by $j_2$ may refer to JFET 101 including the channel stop zone 170.

The characteristics of the curves $j_1$, $j_2$ illustrated in FIG. 6 will be elucidated from right to left with reference to the JFET 100 illustrated in FIG. 1. The lateral n-channel 220 is sandwiched between p$^+$-type gate control region 150 and the p$^+$-type body region 190. By applying a negative gate voltage $V_G$ to the gate control region 150 the first space charge region 240 extends into the second layer 140 from the gate control region 150. Since, in the example used for elucidation, the pn junction formed between the second layer 140 and the body region 150 is not reverse biased for negative values of $V_G$, the voltage drop across the second space charge region 250 is approximately determined by the built-in voltage.

When the first space charge region 240 and the second space charge region 250 contact each other, i.e. $d_3$=0 μm, charge carriers, i.e. electrons, are smoothed out of the channel region 220 and JFET 100 blocks current flow. This condition is known as pinch-off and the respective pinch-off voltage is denoted by $V_{PO1}$ and $V_{PO2}$ in FIG. 6. The values of $V_{PO1}$ and $V_{PO2}$ depend on the dopant concentration and height of the channel region respectively. When further increasing the gate voltage $V_G$ to negative values the pn junction between the second layer 140 and the body region 190 is increasingly operated in forward bias mode. The so-called punch-through voltage $V_{PT1}$, $V_{PT2}$ determines the onset of hole injection from the body region 140 into the channel region 220, i.e. current flow between source and gate. The voltage required to forward bias the pn junction between the body region 190 and the channel region 220 depends on a width of the second space charge region 250 and on the thickness $d_3$ of the channel region, for example. The smaller the width of the second space charge region 250, the higher becomes the built-in electric field, and consequently, the higher becomes the voltage required for punch-through.

The JFETs associated with curves $j_1$ and $j_2$ illustrated in FIG. 6 differ by the presence of the channel stop zone. The JFET associated with curve $j_1$ lacks the channel stop zone. Thus, the second space charge region 250 extends into the n-type second layer 140. The JFET associated with curve $j_2$ includes the n$^+$-type channel stop zone 170. Thus, the second space charge region 250 extends into the n$^+$-type channel stop zone 170. Since the concentration of dopants within the n$^+$-type channel stop zone 170 is higher than the concentration of dopants within the n-type second layer 140, the built-in electric field of the second space charge region 250 of the JFET associated with curve $j_2$ is higher than the built-in electric of the second space charge region 250 of the JFET associated with curve $j_1$. Thus, the voltage $V_{PT2}$ required to achieve punch-through in the JFET associated with curve $j_2$ is higher than the voltage $V_{PT1}$ required to achieve punch-through in the JFET with curve $j_1$. Therefore, the gate voltage window defined by $V_{PT}$-$V_{PO}$ may be increased by formation of the channel stop zone having a higher concentration of dopants than the second layer.

Figure 7:
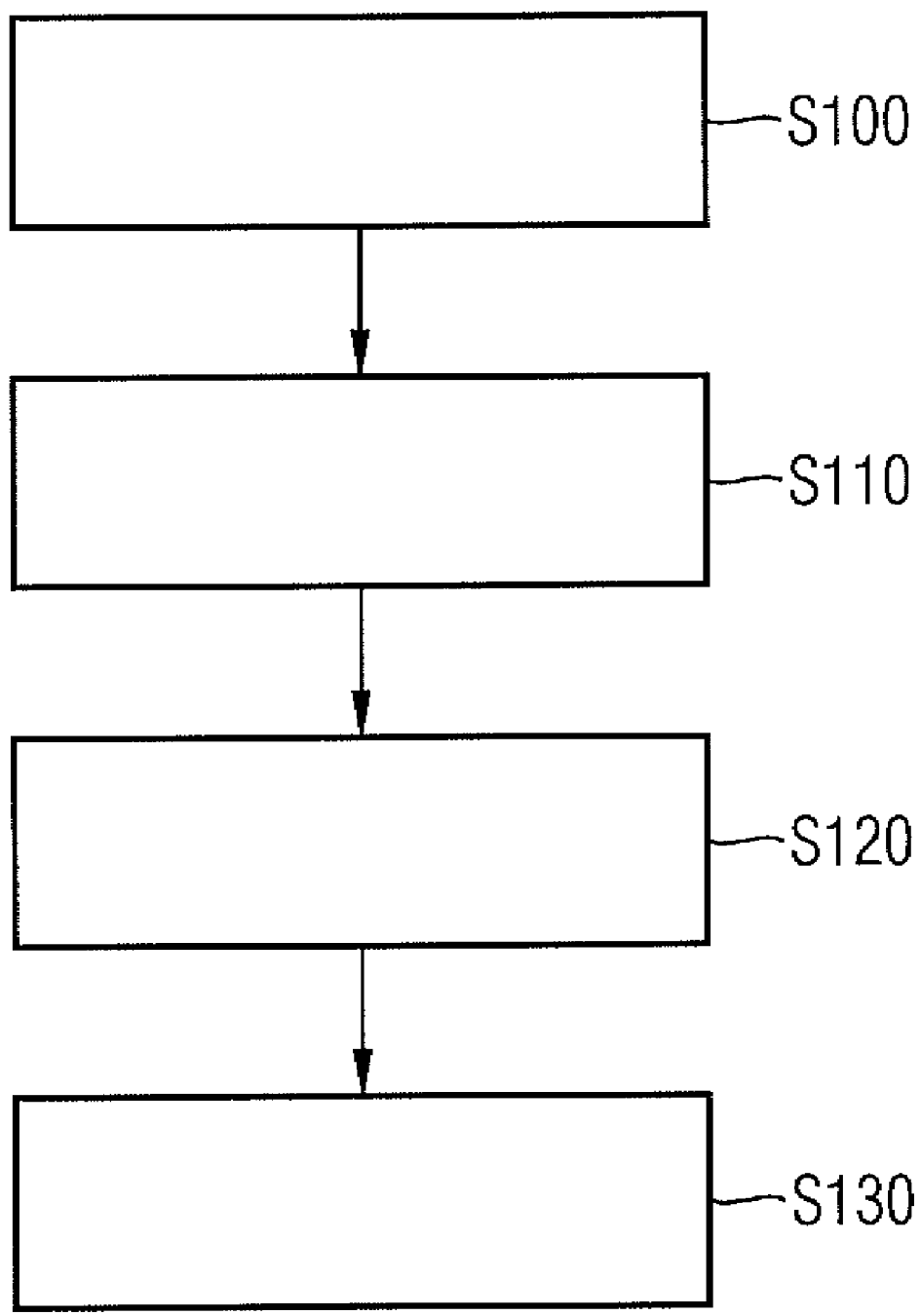
FIG. 7 is a simplified flowchart illustrating a method of manufacturing a semiconductor device according to an embodiment.

FIG. 7 is a simplified flowchart illustrating a method of manufacturing a semiconductor device according to an embodiment.

At S100 a body region of a first conductivity type adjoining a channel region of a second conductivity is formed at a first side of the channel region.

At S110, a gate control region of the first conductivity type adjoining the channel region is formed at a second side of the channel region opposed to the first side, the channel region being configured to be controlled in its conductivity by voltage application between the gate control region and the body region.

At S120, a source zone of the second conductivity type is formed within the body region and, at S130, a channel stop zone of the second conductivity type is arranged at the first side, the channel stop zone being arranged at least partly within at least one of the body region and the channel region, the channel stop zone including a maximum concentration of dopants lower than the maximum concentration of dopants of the source zone.

It is to be noted that above method features denoted S100, S110, S120, S130 may be carried out in a sequence different from S100, S110, S120, S130, e.g. in the sequence S100, S120, S130, S110.

Figure 8A:
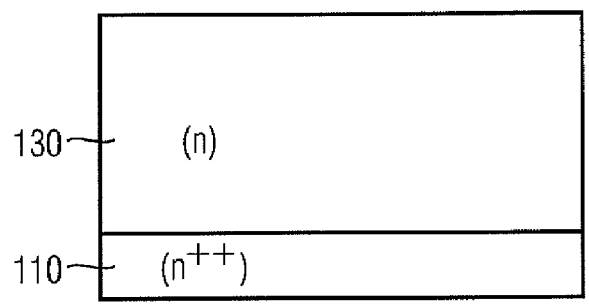
FIGS. 8A to 8C illustrate cross-sectional views of a semiconductor body portion during manufacture of a vertical JFET including a channel stop zone formed by ion implantation and annealing according to another embodiment.
Figure 8B:
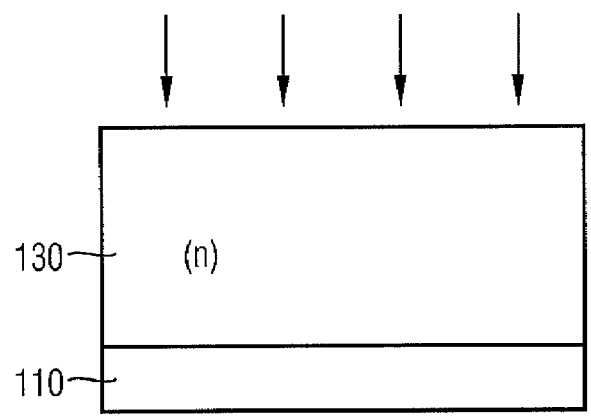
Figure 8C:
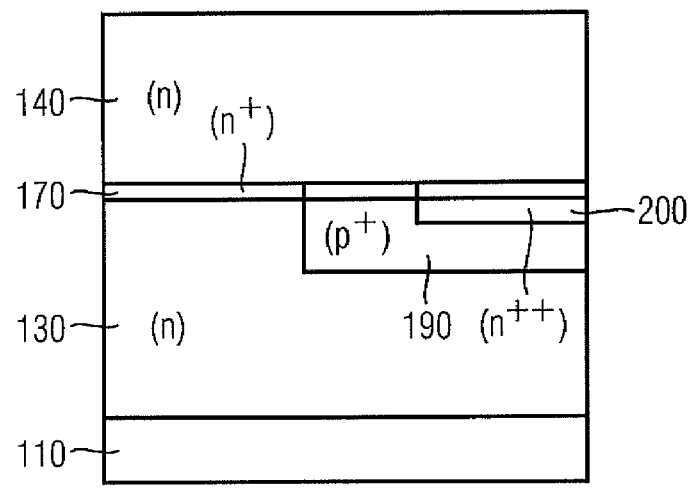

FIGS. 8A to 8C illustrate cross-sectional views of a semiconductor body portion during one embodiment of manufacture of JFET 100 illustrated in FIG. 1, JFET 100 including a channel stop zone formed by ion implantation and annealing.

Referring to FIG. 8A, the first n-type layer 130 is grown on the $n^{++}$-type semiconductor body 110 by epitaxy.

Thereafter, as illustrated in FIG. 8B, ions are implanted into the first n-type layer 130.

Referring to FIG. 8C, the ions implanted into the first n-type layer 130 define the channel stop zone 170, the $p^+$-type body region 190 and the $n^{++}$-type source zone. The ions may be implanted using different implant masks. As an example, the ions defining the channel stop zone 170 may be implanted without a lithographically patterned implant mask. The ions defining the body region 190 and the source zone 200 may be implanted using different lithographically patterned implant masks. On the first n-type layer 130, the second n-type layer 140 is grown by epitaxy.

FIGS. 9A to 9D illustrate cross-sectional views of a semiconductor body portion during one further embodiment of manufacture of JFET 100 illustrated in FIG. 1, JFET 100 including a channel stop zone formed by in-situ doping.

Figure 9A:
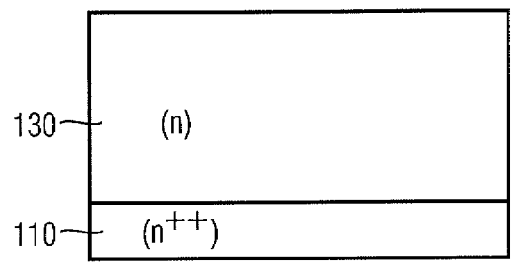
FIGS. 9A to 9D illustrate cross-sectional views of a semiconductor body portion during manufacture of a vertical JFET including a channel stop zone formed by in-situ doping according to yet another embodiment.

Referring to FIG. 9A, the first n-type layer 130 is grown on the $n^{++}$-type semiconductor body 110 by epitaxy.

Figure 9B:
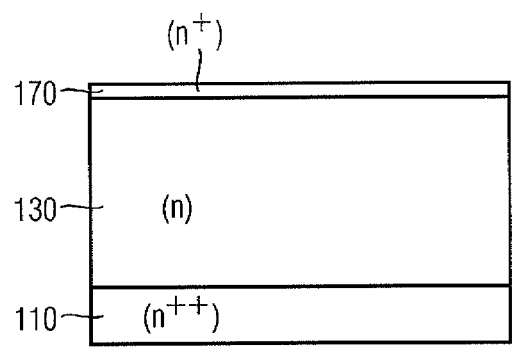
Figure 9C:
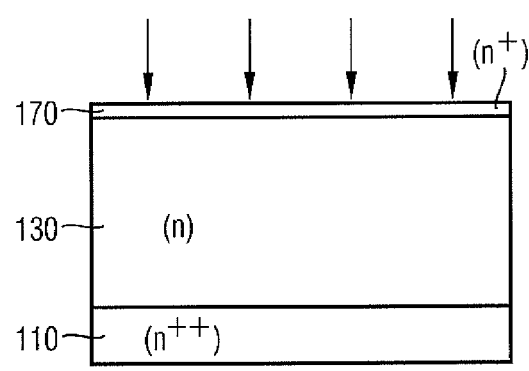

At the end of growth of the first n-type layer 130, as illustrated in FIG. 9B, the $n^+$-type channel stop zone 170 is formed by in-situ doping, i.e. by introducing the respective dopants at the same time the first layer 130 is formed. Then, as illustrated in FIG. 9C similar to FIG. 8B, ions are implanted into the first n-type layer 130.

Figure 9D:
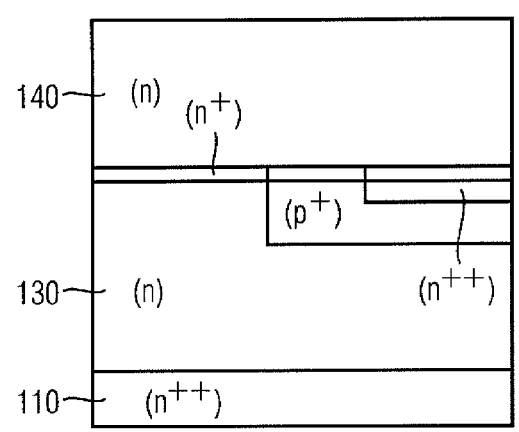

Referring to FIG. 9D, after implanting ions into the first n-type layer 130 to define the $p^+$-type body region 190 and the $n^{++}$-type source zone 200 similar to FIG. 8C, the second n-type layer 140 is grown on the first n-type layer 130 by epitaxy.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiment embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a body region of a first conductivity type adjoining a channel region of a second conductivity at a first side of the channel region;
a gate control region of the first conductivity type adjoining the channel region at a second side of the channel region opposed to the first side, the channel region being configured to be controlled in its conductivity by voltage application between the gate control region and the body region;
a source zone of the second conductivity type within the body region; and
a channel stop zone of the second conductivity type arranged at the first side, the channel stop zone being arranged at least partly within at least one of the body region and the channel region, the channel stop zone including a maximum concentration of dopants lower than a maximum concentration of dopants of the source zone.

2. The semiconductor device of claim 1, wherein
a dimension of the channel stop zone along a direction perpendicular to the first side is within a range of 5 nm to 100 nm.

3. The semiconductor device of claim 1, wherein
a maximum concentration of dopants constituting the channel stop zone is within a range of $10^{17}$ cm$^{-3}$ to $10^{19}$ cm$^{-3}$.

4. The semiconductor device of claim 1, wherein
the semiconductor device is a Vertical Junction Field Effect Transistor.

5. The semiconductor device of claim 1, wherein
the Vertical Junction Field Effect Transistor is an n-channel SiC Vertical Junction Field Effect Transistor including a voltage difference between a pinch-off voltage and a punch through voltage of more than 10 V.

6. The semiconductor device of claim 5, wherein
the punch through voltage is within a range of 20 V to 50 V.

7. The semiconductor device of claim 4, wherein
dimensions of the channel stop zone with regard to the plane of the first side correspond to the dimensions of the body region with regard to said plane.

8. The semiconductor device of claim 4, wherein
the channel stop zone projects an end portion of the body region along a direction parallel to the second side.

9. The semiconductor device of claim 4, wherein
the channel stop zone continuously extends over an active area of the Vertical Junction Field Effect Transistor.

10. The semiconductor device of claim 4, further comprising
a first epitaxial layer including the source zone therein and a second epitaxial layer including the gate control region therein, wherein the first side corresponds to an interface between the first epitaxial layer and the second epitaxial layer.

11. The semiconductor device of claim 4, wherein
a voltage blocking capability of the Vertical Junction Field Effect Transistor between drain and source is within a range of 300 V to 10000 V.

12. An integrated circuit comprising the semiconductor device of claim 1.

13. A method of manufacturing a semiconductor device, comprising:
forming a body region of a first conductivity type adjoining a channel region of a second conductivity at a first side of the channel region;
forming a gate control region of the first conductivity type adjoining the channel region at a second side of the channel region opposed to the first side, the channel region being configured to be controlled in its conductivity by voltage application between the gate control region and the body region;
forming a source zone of the second conductivity type within the body region; and
forming a channel stop zone of the second conductivity type arranged at the first side, the channel stop zone being arranged at least partly within at least one of the body region and the channel region, the channel stop zone including a maximum concentration of dopants lower than a maximum concentration of dopants of the source zone.

14. The method of claim 13, wherein
a single lithographic mask is used for forming both the body region and the channel stop zone.

15. The method of claim 13, wherein
forming the channel stop zone includes introducing dopants into the channel stop zone by ion implantation without use of an implantation mask pattern defined by lithography.

16. The method of claim 13, further comprising
forming a first epitaxial layer prior to the formation of the body region; and
forming a second epitaxial layer on the first epitaxial layer after formation of the body region.

17. The method of claim 16, wherein
forming the channel stop zone includes introducing dopants into the first epitaxial layer by ion implantation before formation of the second epitaxial layer.

18. The method of claim 13, wherein
forming the channel stop zone includes introducing dopants into at least one of the first and second epitaxial layers by in-situ doping.

* * * * *